United States Patent [19]
Sander et al.

[11] Patent Number: 5,656,968
[45] Date of Patent: Aug. 12, 1997

[54] CIRCUIT ARRANGEMENT FOR REGULATING THE LOAD CURRENT OF A POWER MOSFET

[75] Inventors: Rainald Sander, Munich; Jenoe Tihanyi, Kirchheim, both of Germany

[73] Assignee: Siemens Aktiengesellschaft, Munich, Germany

[21] Appl. No.: 558,845

[22] Filed: Nov. 15, 1995

[30] Foreign Application Priority Data

Dec. 14, 1994 [DE] Germany ............... 44 44 623.3

[51] Int. Cl.$^6$ ....................................... G05F 1/10
[52] U.S. Cl. ................... 327/543; 323/266; 323/277
[58] Field of Search ........................ 323/266, 271, 323/276, 277, 278; 327/378, 434, 543

[56] References Cited

U.S. PATENT DOCUMENTS

| | | | |
|---|---|---|---|
| 4,899,098 | 2/1990 | Gariboldi | 323/277 |
| 5,481,179 | 1/1996 | Keeth | 327/543 |
| 5,497,285 | 3/1996 | Nadd | 361/103 |
| 5,523,714 | 6/1996 | Topp et al. | 327/434 |

FOREIGN PATENT DOCUMENTS

| | | |
|---|---|---|
| 0 369 048 A1 | 5/1990 | European Pat. Off. . |
| 0 539 754 A2 | 5/1993 | European Pat. Off. . |

OTHER PUBLICATIONS

Patent Abstracts of Japan—E-1005, Nov. 22, 1990 vol. 14/No. 533.

*Primary Examiner*—Timothy P. Callahan
*Assistant Examiner*—Jung Ho Kim
*Attorney, Agent, or Firm*—Hill, Steadman & Simpson

[57] ABSTRACT

In a circuit arrangement for regulating the load current of a power MOSFET, the drain-source voltage of the power MOSFET is imaged onto the input of a second MOSFET connected between a gate terminal and source terminal of the power MOSFET. When the input voltage exceeds the cut-off voltage, then the gate-source voltage at the power MOSFET is regulated back to a value that corresponds to the sum of the cut-off voltages of the second MOSFET and a third MOSFET. The gate terminals of third MOSFET and the power MOSFET are connected to one another.

6 Claims, 2 Drawing Sheets

5,656,968

CIRCUIT ARRANGEMENT FOR REGULATING THE LOAD CURRENT OF A POWER MOSFET

BACKGROUND OF THE INVENTION

The invention is directed to a circuit arrangement for regulating the load current of a power MOSFET to which a load is connected in series at the source side, and comprising the following features:

a) the drain-source path of a second MOSFET is connected between the gate terminal and the source terminal of the power MOSFET;

b) the gate terminal of a third MOSFET is connected to the gate terminal of the power MOSFET;

c) the drain terminals of the third MOSFET and the power MOSFET are connected to one another.

Such a circuit arrangement has been disclosed, for example, by EP 0 369 048. It is shown in FIG. 3. The circuit arrangement of the prior art contains a power MOSFET 1 at a source side of which a load 2 is connected in series. The series circuit lies at two output terminals 3,4 that are connected to a supply voltage $V_{BB}$. The drain-source path of a second MOSFET 5 lies between the gate terminal G and the source terminal S of MOSFET 1. The series circuit of MOSFET 1 and load 2 has another series circuit composed of a third MOSFET 6 and a current source 7 connected parallel to it. The drain terminal of 6 is connected to the drain terminal of 1. The junction between MOSFET 6 and current source 7 is connected to the gate terminal G of the second MOSFET. The other terminal of the current source is connected to the output terminal 4 that lies at fixed potential, for example ground potential. The gate terminals G of the MOSFETs 6 and 1 are connected to an input terminal 8. The other input terminal is referenced 9 and lies at the same potential as 4, for example ground potential.

The power MOSFET 1 begins to conduct when an input voltage $U_{IN}$ is applied to the input terminals 8,9 insofar as its cut-off voltage is exceeded. The gate terminal of the MOSFET 5 lies at ground potential vie the current source 7. The power MOSFET 1 continues to be driven more conductive with increasing input voltage, whereby the source potential thereof follows the gate potential. The gate potential of the MOSFET 5 (voltage U7) via the current source 7 likewise follows the input voltage and is lower than the latter by the cut-off voltage $U_{r6}$ of the MOSFET 6. When the input voltage reaches a value that is greater than the sum of the supply voltage $V_{BB}$ and the cut-off voltage $U_{r6}$, the MOSFET 6 is fully activated and the potential $V_{BB}$ is present at the gate of MOSFET 5.

During nominal operation, a predetermined voltage $U_{DS}$ drops off at the power MOSFET 1. In case of an overload or of a short of the load 2, the transistor current I1 and, thus, the voltage $U_{DS}$, rise. When this voltage becomes higher than the cut-off voltage $U_{r5}$ of the MOSFET 5, then the latter begins to conduct. The control voltage $U_{GS}$ of MOSFET 1 is then reduced until the voltage $U_{GS}$ corresponds to a reduction of the transistor current I1. The height of the control voltage $U_{GS}$ is limited to the height of the sum of the cut-off voltages $U_{r5}+U_{r6}$. The circuit arrangement employs a power source that is composed of a depletion MOSFET whose gate terminal is connected to the source terminal. Such a depletion FET, however, is more complicated compared to an enhancement FET and cannot be as precisely manufactured. The precision of the over-current limitation therefore leaves something to be desired.

SUMMARY OF THE INVENTION

It is an object of the invention to improve a circuit arrangement of the described type such that it works more precisely with comparable expense.

This object is achieved by the features:

d) the drain-source path of a fourth power MOSFET is connected between the source terminals of the third MOSFET and of the power MOSFET;

e) the gate terminal of the second MOSFET is connected to the junction between third and fourth MOSFETS; and f) all MOSFETs are enhancement FETs.

The invention is described in greater detail on the basis of an exemplary embodiment in conjunction with FIGS. 1 and 2.

DESCRIPTION OF THE PREFERRED EMBODIMENTS

Figure 1:
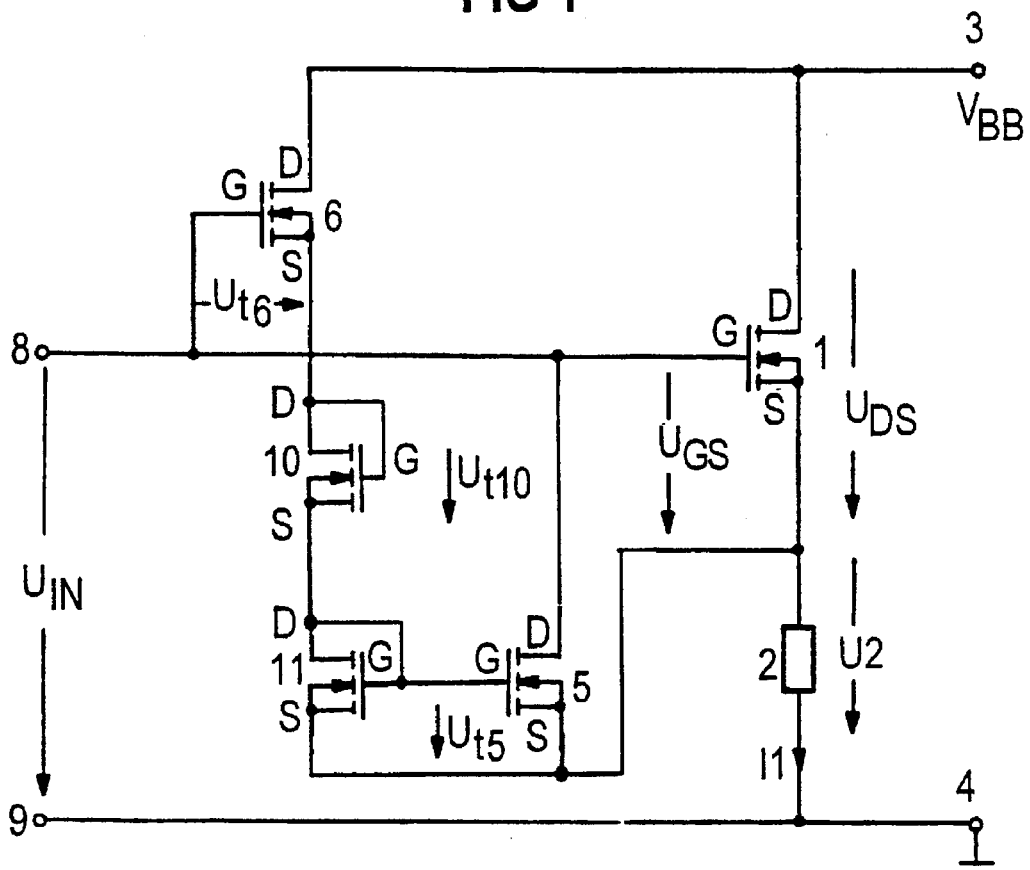
FIG. 1 is a circuit diagram of an exemplary embodiment of the invention.
Figure 3:
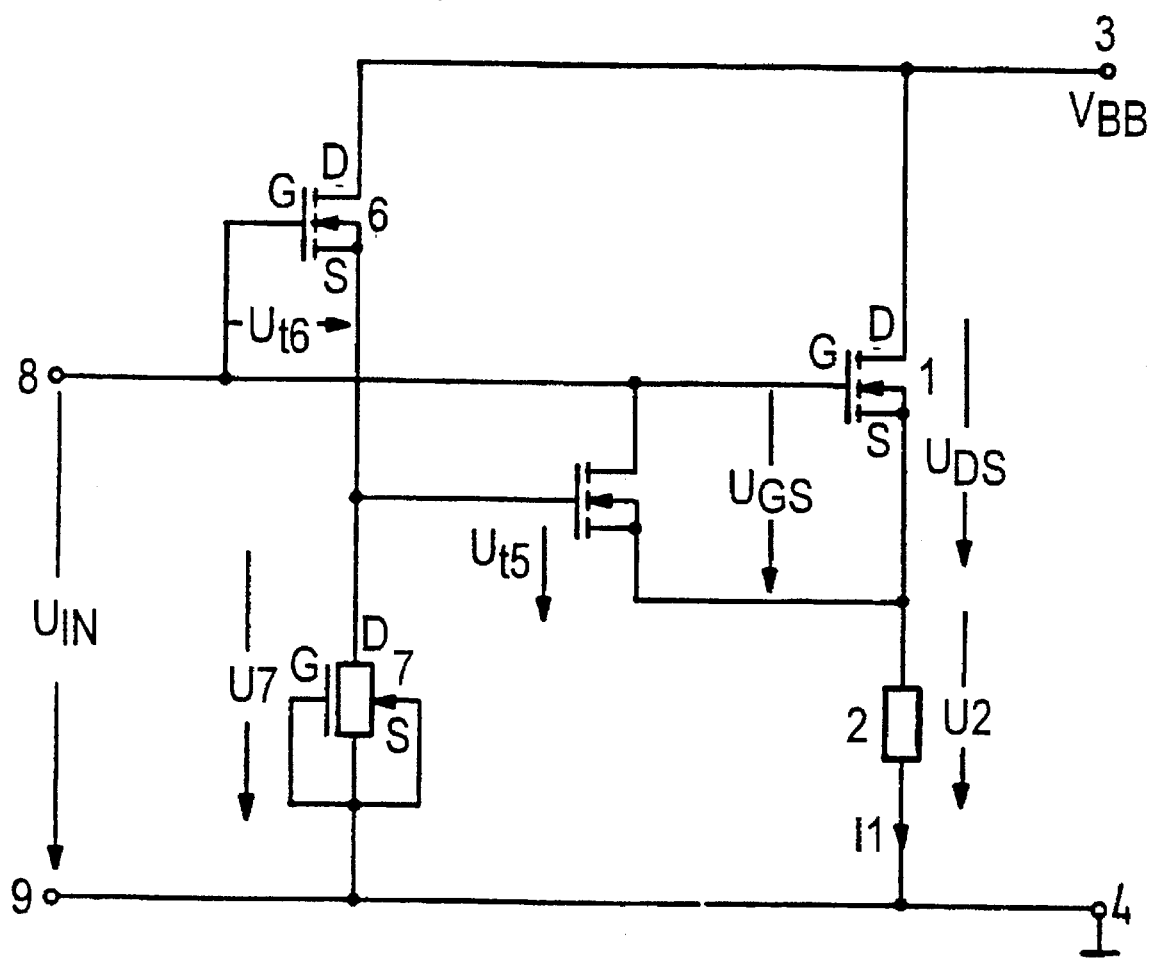
FIG. 3 is a circuit diagram of the prior art.

The circuit arrangement of FIG. 1 differs from that of FIG. 3 essentially in that the drain-source path of an enhancement MOSFET 10 is connected to the source terminal of the enhancement MOSFET 6. A further enhancement MOSFET 11 is connected in series with the MOSFET 10. The source terminal of the MOSFET 11 is connected to the source terminal of the power MOSFET 1 of the enhancement type and to the source terminal of the MOSFET 5. The gate terminal of the MOSFET 5 is connected to the junction between the MOSFET 10 and MOSFET 11. The drain terminals of the MOSFETs 10 and 11 are connected at their respective gate terminals; they therefore each operate as a MOS diode.

The power MOSFET 1 is activated by the input voltage $U_{IN}$. When the input voltage reaches a value that is higher than the sum of $V_{BB}$ and the cut-off voltage $U_{r6}$ of the MOSFET 6, then the latter is fully activated and the voltage $V_{BB}$ is present at the drain terminal of the MOSFET 10.

In this condition, a voltage $U_{GS}$ lies at the gate of the power MOSFET that drives it fully conductive. The current I1 thereby flows. The voltage $U_{DS}$ increases in case of an overload or of a short of the load. When this voltage becomes higher than the sum of the cut-off voltages $U_{r5}$ and $U_{r10}$, then the MOSFET 5 begins to conduct. The gate-source voltage of the power MOSFET 1 is thus reduced until it is again equal to the sum of the voltage $U_{r5}+U_{r10}$. The transistor current I1 is thus reduced. The height of the control voltage $U_{GS}$ is thus limited to the sum of the cut-off voltage $U_{r5}+U_{r6}+U_{r10}$.

Figure 2:
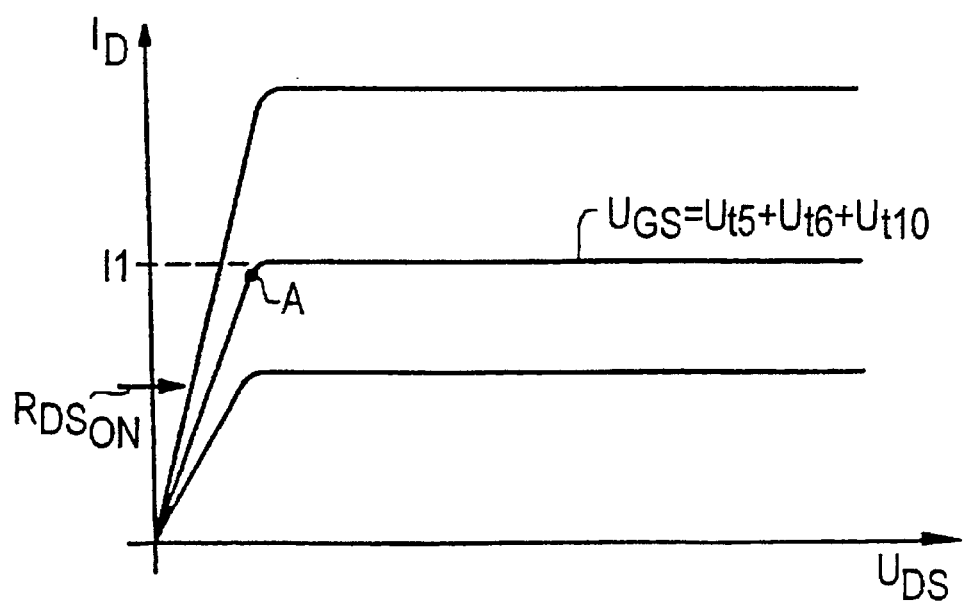
FIG. 2 is an $I_D/U_{DS}$ diagram of the power MOSFET 1 of FIG. 1.

The sum of the cut-off voltages is expediently selected such that an operating point A (FIG. 2) that lies at the salient point between the linear region and the saturation region of the $I_D/U_{DS}$ characteristic of the power MOSFET 1 is set given nominal current. That value of the drain-source voltage $U_{DS}$ at the power MOSFET 1 at which the regulation of the control voltage should begin can thus be defined by the selection of the cut-off voltages $U_{r5}$, $U_{r7}$, $U_{r10}$.

The circuit arrangement can also be realized without the MOSFET 10 when the MOSFET 11 is dimensioned such that it has a cut-off voltage $U'_{r11}$ that is equal to the sum of the cut-off voltages $U_{r10}+U_{r11}$. It is also not absolutely necessary to design the MOSFETs 10 and 11 as MOS diodes. Instead of being connected to the drain terminals, their gate terminals are then connected to a fixed potential.

An especially exact regulation is obtained when the power MOSFET 1 and the MOSFET 6 are implemented in the same technology, i.e., for example, both as vertical MOSFETs or both as lateral MOSFETs. For example, the MOSFET 6 can be composed of one or of a very few cells of the power MOSFET 1. Manufacturing fluctuations then influence the cut-off voltages $U_{t6}$ and $U_{t1}$ in the same way. When the MOSFETs 11 and 5 are designed such that they have the same cut-off voltage, then the MOSFETs 11 and 5 form a current mirror. When the MOSFET 5 is dimensioned such that it has a multiple of the current carrying ability of the MOSFET 11, then the current flowing through the MOSFET 5 can be matched to the properties of the control voltage source and to the properties of the power MOSFET 1. The current flowing through the MOSFETs 6,10 and 11 can thereby be kept low.

Although various minor changes and modifications might be proposed by those skilled in the art, it will be understood that our wish is to include within the claims of the patent warranted hereon all such changes and modifications as reasonably come within our contribution to the art.

We claim as our invention:

1. A circuit arrangement for regulating a load current of a first power MOSFET to which a load is connected in series at a source side of the first power MOSFET, comprising:
   a drain-source path of a second MOSFET being connected between a gate terminal and a source terminal of the first power MOSFET;
   a gate terminal of a third MOSFET being connected to the gate terminal of the first power MOSFET;
   drain terminals of the third MOSFET and the first power MOSFET being connected to one another;
   a drain-source path of a fourth power MOSFET being connected between a source terminal of the third MOSFET and the source terminal of the first power MOSFET;
   a gate terminal of the second MOSFET being connected to a gate terminal of the fourth MOSFET and to a junction between the third and fourth MOSFETs;
   all MOSFETs being enhancement FETs; and
   a drain-source path of a fifth MOSFET being connected between the drain-source path of the fourth MOSFET and a drain-source path of the third MOSFET.

2. A circuit arrangement according to claim 1 wherein the first power MOSFET and the third MOSFET are constructed in a same technology.

3. A circuit arrangement according to claim 1 wherein the second MOSFET and fourth MOSFET have a same cut-off voltage, and the fourth MOSFET is connected as a diode.

4. A circuit arrangement according to claim 3 wherein the second MOSFET has a higher current-carrying ability then the fourth MOSFET.

5. A circuit arrangement according to claim 1 wherein a gate terminal of the fifth MOSFET is connected to a drain of the fifth MOSFET.

6. A circuit arrangement, comprising:
   a first power MOSFET having a load connected in series with a drain-source path thereof, and wherein a power source is connected to a drain of the first power MOSFET;
   a second MOSFET having its drain-source path connected between a gate of said first power MOSFET and a source of said first power MOSFET;
   a third MOSFET having its drain-source path connected between said gate of said first power MOSFET and said power source, and a gate of said third MOSFET connecting to said gate of said first power MOSFET;
   a fourth MOSFET having its drain-source path connected between said source of said first power MOSFET and a source of said third MOSFET;
   a gate of said second MOSFET connecting to a gate of said fourth MOSFET, and a gate of said fourth MOSFET connecting to a drain of said fourth MOSFET;
   an input being provided at a gate of said first MOSFET; and
   a drain-source path of a fifth MOSFET being connected between the drain-source path of the fourth MOSFET and a drain-source path of the third MOSFET.

* * * * *